(12) United States Patent
Rana

(10) Patent No.: US 8,461,899 B2
(45) Date of Patent: Jun. 11, 2013

(54) NEGATIVE VOLTAGE LEVEL SHIFTER CIRCUIT

(75) Inventor: Vikas Rana, Pehowa (IN)

(73) Assignee: STMicroelectronics International N.V., Amsterdam (NL)

( * ) Notice: Subject to any disclaimer, the term of this patent is extended or adjusted under 35 U.S.C. 154(b) by 70 days.

(21) Appl. No.: 13/172,625

(22) Filed: Jun. 29, 2011

(65) Prior Publication Data

US 2012/0182060 A1    Jul. 19, 2012

(30) Foreign Application Priority Data

Jan. 14, 2011 (IN) ................. 85/DEL/2011

(51) Int. Cl.
*H03L 5/00* (2006.01)
(52) U.S. Cl.
USPC ................. 327/333; 326/61; 326/80

(58) Field of Classification Search
USPC .............. 326/62–63, 80–81; 327/306, 333
See application file for complete search history.

(56) References Cited

U.S. PATENT DOCUMENTS

| | | | | |
|---|---|---|---|---|
| 5,872,476 A | * | 2/1999 | Mihara et al. | 327/333 |
| 6,011,421 A | * | 1/2000 | Jung | 327/333 |
| 6,060,904 A | * | 5/2000 | Shimoda | 326/68 |
| 7,733,126 B1 | * | 6/2010 | Choy et al. | 326/68 |
| 8,218,377 B2 | * | 7/2012 | Tandon et al. | 365/189.11 |

* cited by examiner

*Primary Examiner* — Dinh T. Le
(74) *Attorney, Agent, or Firm* — Hogan Lovells US LLP

(57) ABSTRACT

A negative voltage level shifter circuit includes a pair of input transistors, a gate of each input transistor being driven by one of an input signal and an inverted version of the input signal, a cascode sub-circuit coupled to the pair of input transistors, and a pair of cross-coupled transistors for locking a state of the voltage level shifter depending on the input signal, wherein respective gates of the cross-coupled transistors are driven by outputs of respective comparator sub-circuits.

20 Claims, 4 Drawing Sheets

NEGATIVE VOLTAGE LEVEL SHIFTER CIRCUIT

RELATED APPLICATION

The present application claims priority of India Application No. 85/DEL/2011 filed Jan. 14, 2011, which is incorporated herein in its entirety by reference.

FIELD OF INVENTION

The present invention broadly relates to a negative voltage level shifter circuit and a method for shifting a voltage level of an input signal.

SUMMARY OF THE INVENTION

A negative voltage level shifter circuit comprises a pair of input transistors, a gate of each input transistor being configured to be driven by one of an input signal and an inverted version of the input signal; a cascode sub-circuit configured to be coupled to the pair of input transistors; and a pair of cross-coupled transistors for locking a state of the voltage level shifter depending on the input signal; wherein the pair of cross-coupled transistors is configured such that respective gates of the cross-coupled transistors are driven by outputs of respective comparator sub-circuits.

BACKGROUND

A negative voltage level shifter is a circuit that shifts a logic level signal to a negative voltage level. Negative voltage level shifters are basic building blocks in all non-volatile memories, which require high positive and negative voltages for their program and erase operations.

FIG. 1 shows a basic conventional negative level shifter circuit 100. The circuit 100 uses 8 transistors (4 p-type metal-oxide-semiconductor (PMOS) transistors and 4 n-type metal-oxide-semiconductor (NMOS) transistors) and one inverter 102. PMOS transistors MP3 and MP4 act as one cascode stage where their gates are driven by a supply voltage named GCASC. Similarly, NMOS transistors MN1 and MN2 act as another cascode stage, and their gates are also driven by the supply voltage GCASC. The circuit 100 uses three supply signals, namely VDD, VNEG and GCASC. Input signals IN and IN_N are typically of VDD voltage level. There are four output signals OUTH, OUTHN, OUT and OUTN, which can vary from VDD to VNEG depending upon the input signal. Table 1 shows the truth table for the negative level shifter circuit 100.

TABLE 1

| INPUT | OUTPUT | | | |
|---|---|---|---|---|
| IN | OUT | OUTN | OUTH | OUTHN |
| 0 | VNEG | GCASC-Vtn | VNEG | VDD |
| VDD | VCASC-Vtn | VNEG | VDD | VNEG | where Vtn is the threshold voltage of the NMOS transistors.

However, in circuit 100, outputs OUT and OUTN are taken from the nodes which are not very well driven. As shown in Table 1, output signals OUT and OUTN may each vary from GCASC-Vtn to VNEG. That is, some outputs of the circuit are dependent on the threshold voltage Vtn of the NMOS transistors. If there is any variation in threshold voltage Vtn, the output level also changes accordingly.

Also, when a user drives a capacitive load from outputs OUT and OUTN of circuit 100, the circuit may become very slow. This is because these nodes are not very well driven and any extra capacitance can slow down the circuit behaviour. This problem becomes more severe when the supply voltage VNEG is more negative (e.g. more than safe operating area (SOA) limit of transistors).

To address the issue of varying voltage levels, in an existing approach, cross-coupled PMOS transistors are added to the circuit. FIG. 2 shows a common negative level shifter circuit 200 according to a prior art approach. The circuit 200 uses 10 transistors (6 PMOS transistors and 4 NMOS transistors) and one inverter 202. PMOS transistors MP1 and MP2 are used as the input transistors. PMOS transistors MP3 and MP4 are used as one cascode stage which prevents the path between supplies VDD and VNEG. Similarly, NMOS transistors MN1 and MN2 are used as another cascode stage which prevents the direct path between VDD and negative voltage VNEG. Transistors MN3 and MN4 are used as cross-coupled NMOS logic, which depending upon the input signal, decides the output voltages and locks the state. Another cross-coupled pair is made using PMOS transistors MP5 and MP6. This pair forces the output nodes OUT and OUTN to full GCASC level and locks the state. The circuit 200 also uses three supply voltages, namely VDD, VNEG and GCASC. Input signals IN and IN_N are of VDD voltage level. There are four output signals OUTH, OUTHN, OUT and OUTN, which may vary from VDD to VNEG depending upon the input signal. Table 2 shows the truth table for the negative level shifter circuit 200.

TABLE 2

| INPUT | OUTPUT | | | |
|---|---|---|---|---|
| IN | OUT | OUTN | OUTH | OUTHN |
| 0 | VNEG | GCASC | VNEG | VDD |
| VDD | VCASC | VNEG | VDD | VNEG |

However, in the circuit 200, the cross-coupled PMOS transistors add a more critical issue. For example, if the input signal IN changes from "0" to VDD, the inverted input signal IN_N changes from VDD to "0" which, in turn, pulls up the output OUTH to VDD via PMOS transistors MP2 and MP4. As output OUTH is charged to VDD and similarly output OUTHN is discharged to the threshold voltage Vtp of the PMOS transistors, according to the cross-coupled action (at NMOS transistors MN3 and MN4), output OUT should be charged to "GCASC-Vtn" (which has earlier been discharged to VNEG). Once output OUT node charges to "GCASC-Vtn", it discharges the output node OUTN to VNEG and eventually PMOS transistors MP5 and MP6 locks the output nodes OUT and OUTN to GCASC and VNEG. However, if output nodes OUT and OUTN do not get charged or discharged to the right direction (which can be possible because of reasons such as heavy load capacitance, unbalanced capacitive load at OUT and OUTN nodes, i.e. one of the nodes drives more capacitance than the other, etc.), the PMOS transistors can lock the output nodes at the wrong voltage level, which can cause a static current path in the circuit and eventually a functionality failure. This problem is more prominent in circuits with more negative supplies.

In another example, suppose IN="0" which forces IN_N="VDD", then user expects output node OUT to be at VNEG voltage level and output node OUTN at GCASC voltage level; and similarly, output node OUTH at VNEG and output node OUTHN at VDD voltage levels, respectively. However, because of unbalanced load capacitance, output OUTN tries to be locked at VNEG voltage (rather than GCASC). For this locking system, PMOS transistors MP5 and MP6 are triggered. As output OUTN goes more than the "GCASC" voltage level, a current path forms from VDD to VNEG via transistors MP1, MP3, MN1 and MN3. This current path drops the VDD voltage level or moves VNEG voltage level slightly positive. This change in voltage levels can eventually cause the functionality failure.

Another issue with cross-coupled PMOS transistor pair (here MP5 and MP6) is that there is a junction voltage stress across the bulk and drain junctions, as the bulk junctions of these PMOS transistors can be biased at supply voltage "VDD" or minimum at "Ground" level. The sources of both PMOS are connected at GCASC voltage and the drains of both transistors can go up to VNEG voltage level. Thus, whenever the drain of any PMOS transistor is at VNEG voltage level, there is a bulk-to drain-junction voltage stress. This stress typically increases with more negative values of VNEG voltage. This stress can cause a reliability issue in the circuit.

Further, these PMOS transistors are typically made very weak because their strength affects the size of the cross-coupled NMOS pair (MN3 and MN4). On the other hand, if their size is made small, it will slow down the circuit response. This can be slower for high capacitive load.

FIG. 3 shows a multi-stage, here a two-stage, negative level shifter circuit 300 according to another prior art approach. In this circuit 300, the $1^{st}$ stage is made using inverter 302 and 4 transistors. PMOS transistors MP1 and MP2 act as the input pass transistors and NMOS transistors MN1 and MN2 are used as a cross-coupled pair. The supply to $1^{st}$ stage is chosen in such a way that none of the transistors is in a stress condition. Two output signals are taken from $1^{st}$ stage, namely OUT1 and OUTN1, and are provided as inputs of the $2^{nd}$ stage which comprises two PMOS transistors MP3 and MP4, and cross-coupled NMOS transistors MN3 and MN4. The supply to the $2^{nd}$ stage is chosen depending on several criteria. For example, none of the transistors should be in stress condition; supply NEG2 should be less than (i.e. more negative) supply NEG1, e.g. by at least (Vtp+margin), so that output signals OUT1 and OUTN1 are able to pass and block supply NEG2; if the level of shift of supply VNEG is still not obtained, a $3^{rd}$ stage should be added and the outputs of $2^{nd}$ stage become the inputs of $3^{rd}$ stage. Table 3 shows the truth table of two-stage negative level shifter circuit 300.

TABLE 3

| INPUT | OUTPUT | | | |
|---|---|---|---|---|
| IN | OUT1 | OUTN1 | OUT2 | OUTN2 |
| 0 | NEG1 | VDD | VNEG | NEG2 |
| VDD | VDD | NEG1 | NEG2 | VNEG |

The circuit 300 can be used for a high negative voltage level shifter. However, a main issue with this approach is that the complete circuit has to be broken down into multiple stages (until the exact voltage level shift is achieved), and for each stage different voltages are needed. For example, if the circuit is broken down into two stages then at least 4 supply voltages are required. If a more negative voltage is desired, the number of stages may increase. On the other hand, it is typically very difficult to provide these multiple supplies on any of the system on a chip (SOC). Another issue with this approach is that an output signal continuously varying between VDD and VNEG is typically not obtained. Rather, output signals are available in different segments, e.g. between VDD and NEG1 or between NEG2 and VNEG.

A need therefore exists to provide a negative voltage level shifter circuit that seeks to address at least one of the above problems.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
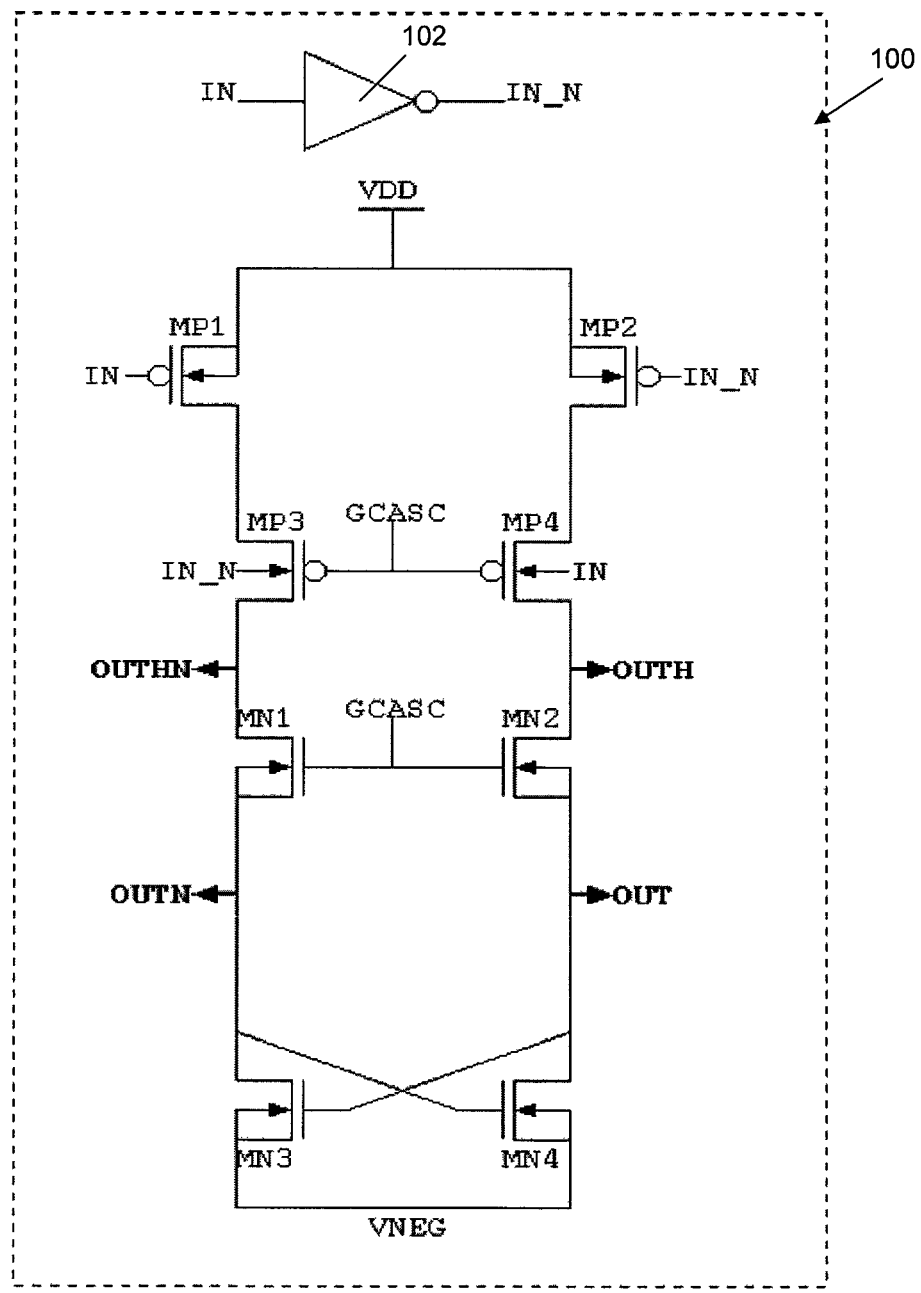
FIG. 1 shows a basic conventional negative level shifter circuit.
Figure 2:
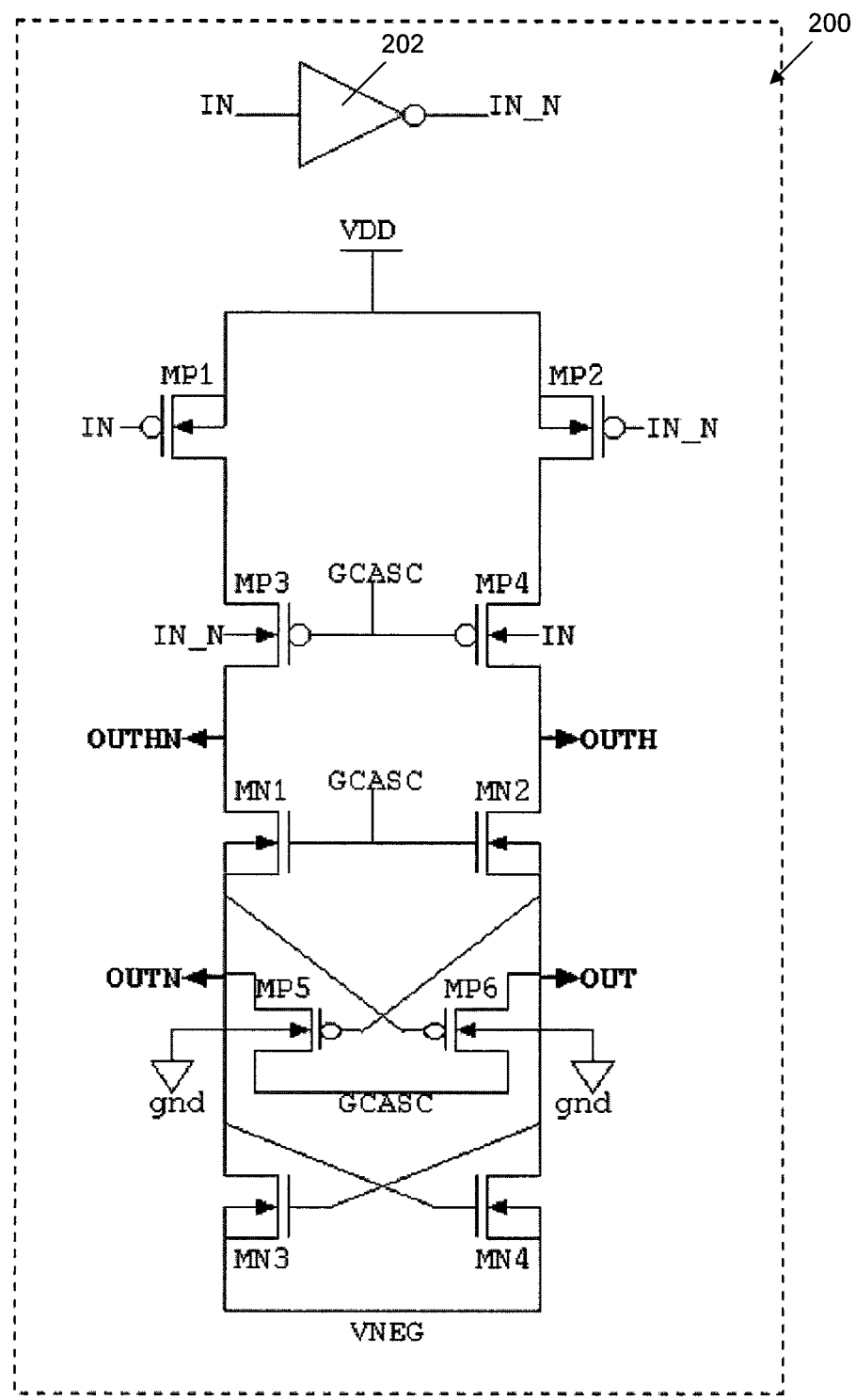
FIG. 2 shows a common negative level shifter circuit according to a prior art approach.
Figure 3:
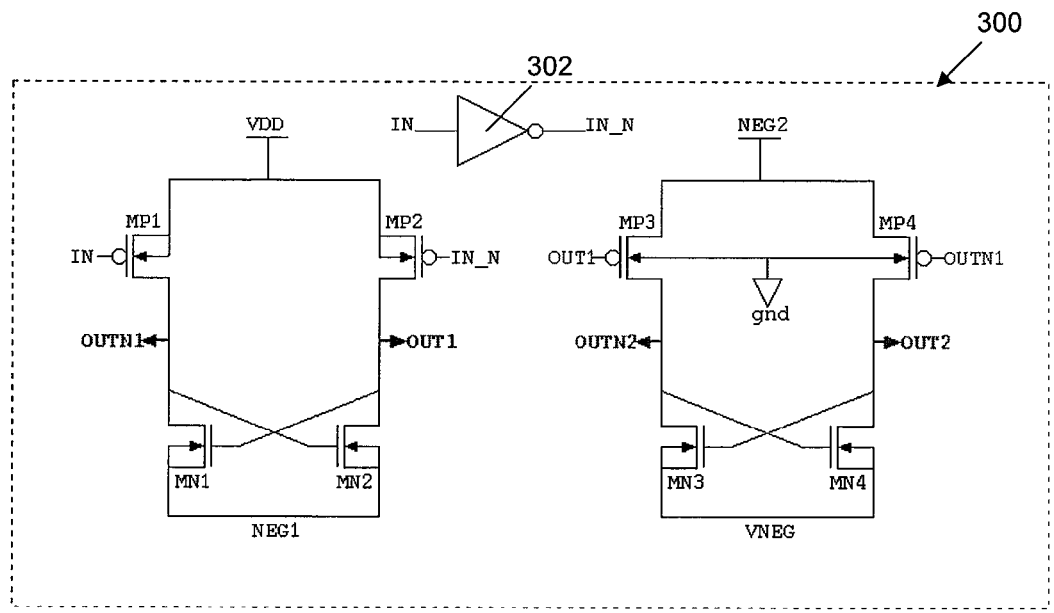
FIG. 3 shows a multi-stage, here a two-stage, negative level shifter circuit according to another prior art approach.

The example embodiments provide a negative voltage level shifter circuit, which preferably uses a minimum number of supply voltages and eliminates voltage stress at each transistor, and in which output voltage levels are well driven to specific voltages, at relatively high speeds.

In accordance with a first aspect of an example embodiment, there is provided a negative voltage level shifter circuit comprising:

a pair of input transistors, a gate of each input transistor being configured to be driven by one of an input signal and an inverted version of the input signal;

a cascode sub-circuit configured to be coupled to the pair of input transistors; and a pair of cross-coupled transistors for locking a state of the voltage level shifter depending on the input signal;

wherein the pair of cross-coupled transistors is configured such that respective gates of the cross-coupled transistors are driven by outputs of respective comparator sub-circuits.

The cascode sub-circuit may comprise a first cascode stage comprising a pair of PMOS transistors configured to be coupled to the respective input transistors.

The cascode sub-circuit may further comprise a second cascode stage comprising a pair of NMOS transistors configured to be coupled to the respective PMOS transistors of the first cascode stage.

The cascode sub-circuit may be configured to provide a pair of output signals OUTH and OUTHN between respective PMOS and NMOS transistors of the first and second cascode stages respectively.

The comparator sub-circuits may be configured to compare the output signals OUTH and OUTHN respectively with a cascode supply voltage.

The comparator sub-circuits may be configured to provide output signals OUT and OUTN for driving the gates of the cross-coupled transistors.

The circuit may be configured such that when the input signal is low, the output signal OUT is at a negative supply voltage, the output signal OUTN is at the cascode supply voltage, the output signal OUTH is at the negative supply voltage, and the output signal OUTHN is at a positive supply voltage.

The circuit may be configured such that when the input signal is high, the output signal OUT is at the cascode supply voltage, the output signal OUTN is at a negative supply voltage, the output signal OUTH is at a positive supply voltage, and the output signal OUTHN is at the negative supply voltage.

Each comparator sub-circuit may comprise a pair of NMOS transistors.

In accordance with a second aspect of an example embodiment, there is provided a method of shifting a voltage level of an input signal, the method comprising using a pair of cross-coupled transistors to lock a state of the voltage level shifter depending on the input signal, wherein respective gates of the cross-coupled transistors are driven by outputs of respective comparator sub-circuits.

The method may further comprise providing, when the input signal is low, an output signal OUT at a negative supply voltage, an output signal OUTN at a cascode supply voltage, an output signal OUTH at the negative supply voltage, and an output signal OUTHN at a positive supply voltage.

The method may further comprise providing, when the input signal is high, an output signal OUT at a cascode supply voltage, an output signal OUTN at a negative supply voltage, an output signal OUTH at a positive supply voltage, and an output signal OUTHN at the negative supply voltage.

Figure 4:
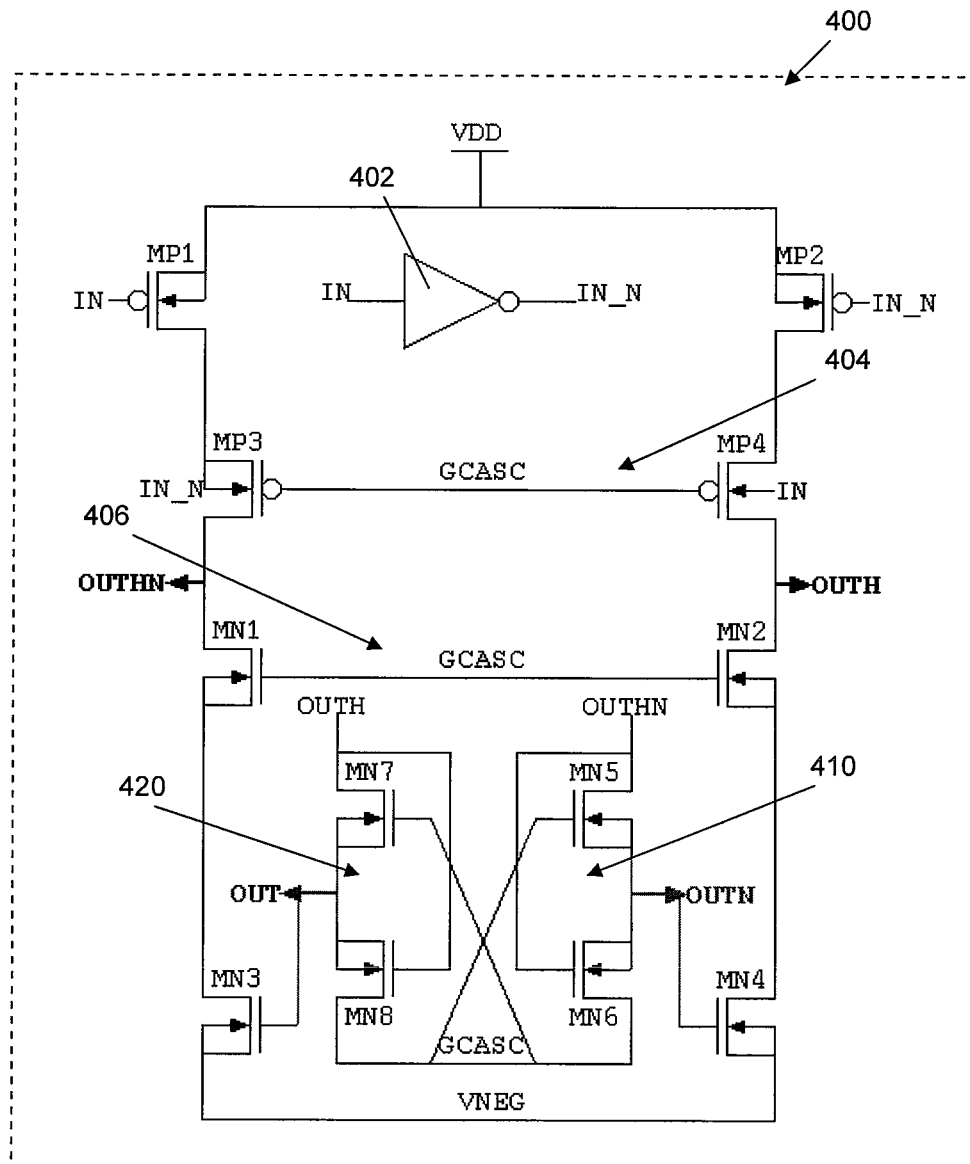
FIG. 4 shows a negative voltage level shifter circuit according to an example embodiment.

FIG. 4 shows a negative voltage level shifter circuit 400 according to an example embodiment. In the circuit 400, inverted input signal IN_N is obtained from the input signal IN via an inverter 402, and PMOS transistors MP1 and MP2 act as the input pair to the input signals. PMOS transistors MP3 and MP4 act as one cascode stage 404 where their gates are driven by cascode supply voltage GCASC. Here, supply voltage GCASC comprises a negative voltage and its voltage level is chosen depending on e.g. a negative supply voltage VNEG. Similarly, NMOS transistors MN1 and MN2 act as another cascode stage 406, and their gates are also driven by cascode supply voltage GCASC. Additionally, NMOS transistors MN3 and MN4 are used as a cross-coupled pair of pass transistors whose gates are driven by respective outputs from comparator sub-circuits (described in detail below). Further, as shown in FIG. 4, transistors MN5 and MN6 are used as a comparator 410. Similarly, transistors MN7 are MN8 are used as another comparator 420. Each of comparators 410, 420 compares two different voltage signals (e.g. OUTH and GCASC; OUTHN and GCASC) and provides the lower voltage level as output OUT or OUTN, respectively.

For example, when input IN is "0" (low), inverted input IN_N is "VDD" (high). In one example embodiment, input node IN pulls-up output node OUTHN to "VDD" level via PMOS transistors MP1 and MP3, and inverted input IN_N disables the path between supply voltage VDD and output OUTH via PMOS transistors MP2 and MP4. Thus, output node OUTH, which was at VDD level, discharges to junction threshold voltage Vt through a drain-bulk junction of PMOS transistor MP4. Output node OUTHN (which is pulled-up to VDD) is compared with supply voltage GCASC (which is a negative voltage) using the comparator 410 (made up of NMOS transistors MN5 and MN6). The output of this comparator 410 is OUTN (now at GCASC level), which drives the NMOS transistor MN4. As the gate of NMOS transistor MN4 is of GCASC level, it pulls-down the output node OUTH to negative supply voltage VNEG level via NMOS transistors MN2 and MN4.

Again, output OUTH is compared with supply voltage GCASC using the comparator 420 (made up of NMOS transistors MN7 and MN8). The output of this comparator 420 is OUT (which is at negative supply voltage VNEG level), which drives the gate of another NMOS transistor MN3. The NMOS transistor MN3 then disables the path between positive supply voltage VDD and negative supply voltage VNEG. In an example embodiment, typical values for VDD, GCASC and VNEG are 1.8 Volts (V), −3V and −8V respectively. It will be appreciated that these values may vary depending on the actual application.

Similarly, when input node IN changes from "0" (low) to "VDD" (high), it disables the path between output OUTHN and supply voltage VDD. Output OUTHN discharges to junction threshold voltage Vt through the drain-bulk junction of PMOS transistor MP3. On the other hand, inverted input node IN_N changes from "VDD" to "0" and pulls-up the output node OUTH to supply voltage "VDD" level via PMOS transistors MP2 and MP4. Output node OUTH is compared with cascode supply voltage GCASC, and forces the output node OUT to be at cascode supply voltage GCASC level. Output node OUT then drives the gate of NMOS transistor MN3, which pulls-down the output node OUTHN (which was floating) to supply voltage VNEG level. Again, output node OUTHN is compared with cascode supply voltage GCASC level, which forces the output node OUTHN to be at supply voltage VNEG level. Further, output node OUTHN drives the gate of NMOS transistor MN4, which disables the path between supply voltages VDD and VNEG.

Table 4 shows the truth table of the negative voltage level shifter circuit 400 according to an example embodiment.

TABLE 4

| INPUT | OUTPUT | | | |
|---|---|---|---|---|
| IN | OUT | OUTN | OUTH | OUTHN |
| 0 | VNEG | GCASC | VNEG | VDD |
| VDD | GCASC | VNEG | VDD | VNEG |

The negative voltage level shifter circuit according to an example embodiment requires fewer supplies as compared to a conventional two-stage voltage level shifter, for example. In addition, there is substantially no voltage stress across any transistor, thus no reliability issue nor functionality failure. Also, multiple output voltage levels are obtainable, in a full range from VDD to VNEG. The negative voltage level shifter circuit according to an example embodiment also has a high speed compared to e.g. a single-stage cascoded level shifter, even for a high capacitance load. Using this circuit, the supply voltage VNEG can be lowered to as much as twice the SOA limit of the transistors. That is, low voltage transistors can be used for a relatively high negative level shift.

It will be appreciated by a person skilled in the art that numerous variations and/or modifications may be made to the present invention as shown in the specific embodiments without departing from the invention as broadly described. For example, the threshold voltage of the transistors may vary in different simulation conditions. Also, other comparator sub-circuits that can compare two different voltages and pass the small voltage at output can be used in place of those described. The present embodiments are, therefore, to be considered in all respects to be illustrative and not restrictive.

The invention claimed is:

1. A negative voltage level shifter circuit comprising:
a pair of input transistors, a gate of each input transistor being configured to be driven by one of an input signal and an inverted version of the input signal;
a cascode sub-circuit configured to be coupled to the pair of input transistors;
a pair of cross-coupled transistors coupled to the cascode sub-circuit for locking a logic state of the voltage level shifter depending on the input signal; and a pair of NMOS comparator sub-circuits coupled to the cascode sub-circuit and the pair of cross-coupled transistors, wherein the pair of cross-coupled transistors is configured such that respective gates of the cross-coupled transistors are driven by outputs of respective comparator sub-circuits.

2. The circuit as claimed in claim 1, wherein the cascode sub-circuit comprises a first cascode stage comprising a pair of PMOS transistors configured to be coupled to the respective input transistors.

3. The circuit as claimed in claim 2, wherein the cascode sub-circuit further comprises a second cascode stage comprising a pair of NMOS transistors configured to be coupled to the respective PMOS transistors of the first cascode stage.

4. The circuit as claimed in claim 3, wherein the cascode sub-circuit is configured to provide a pair of output signals OUTH and OUTHN between respective PMOS and NMOS transistors of the first and second cascode stages respectively.

5. The circuit as claimed in claim 4, wherein the comparator sub-circuits are configured to compare the output signals OUTH and OUTHN respectively with a cascode supply voltage.

6. The circuit as claimed in claims 4, wherein the comparator sub-circuits are configured to provide output signals OUT and OUTN for driving the gates of the cross-coupled transistors.

7. The circuit as claimed in claim 4, configured such that when the input signal is low, the output signal OUT is at a negative supply voltage, the output signal OUTN is at the cascode supply voltage, the output signal OUTH is at the negative supply voltage, and the output signal OUTHN is at a positive supply voltage.

8. The circuit as claimed in claim 4, configured such that when the input signal is high, the output signal OUT is at the cascode supply voltage, the output signal OUTN is at a negative supply voltage, the output signal OUTH is at a positive supply voltage, and the output signal OUTHN is at the negative supply voltage.

9. A method of shifting a voltage level of an input signal, the method comprising using a pair of cross-coupled transistors to lock a logic state of a voltage level shifter depending on the input signal, wherein respective gates of the cross-coupled transistors are driven by outputs of respective NMOS comparator sub-circuits, and wherein each of the NMOS comparator sub-circuits compare a cascode voltage of the voltage level shifter to an output voltage of the voltage level shifter.

10. The method as claimed in claim 9, further comprising providing, when the input signal is low, an output signal OUT at a negative supply voltage, an output signal OUTN at a cascode supply voltage, an output signal OUTH at the negative supply voltage, and an output signal OUTHN at a positive supply voltage.

11. The method as claimed in claim 9, further comprising providing, when the input signal is high, an output signal OUT at a cascode supply voltage, an output signal OUTN at a negative supply voltage, an output signal OUTH at a positive supply voltage, and an output signal OUTHN at the negative supply voltage.

12. A voltage shifter comprising:
an input stage configured to receive a differential input signal;
a cascode sub-circuit coupled to the input stage configured to receive a cascode voltage and to provide a differential output voltage;
a pair of transistors coupled to the cascode sub-circuit;
a pair of NMOS comparator circuits configured for comparing the cascode voltage to the differential output voltage and for driving the pair of transistors.

13. The voltage shifter as claimed in claim 12, wherein the input stage comprises a pair of PMOS transistors.

14. The voltage shifter as claimed in claim 12 wherein the cascode sub-circuit comprises a first and a second cascode stage.

15. The voltage shifter as claimed in claim 14 wherein the first cascode stage comprises a PMOS cascode stage.

16. The voltage shifter as claimed in claim 14 wherein the second cascode stage comprises an NMOS cascode stage.

17. The voltage shifter as claimed in claim 12 wherein the pair of NMOS comparator circuits comprises a first comparator circuit for comparing a first single-ended output voltage and a second comparator circuit for comparing a second single-ended output voltage.

18. The voltage shifter as claimed in claim 17 wherein the first comparator circuit comprises two NMOS transistors coupled together.

19. The voltage shifter as claimed in claim 17 wherein the second comparator circuit comprises two NMOS transistors coupled together.

20. The voltage shifter as claimed in claim 12 wherein the input stage is coupled to VDD and the pair of transistors is coupled to a source of negative supply voltage.

* * * * *

UNITED STATES PATENT AND TRADEMARK OFFICE
CERTIFICATE OF CORRECTION

PATENT NO. : 8,461,899 B2
APPLICATION NO. : 13/172625
DATED : June 11, 2013
INVENTOR(S) : Vikas Rana It is certified that error appears in the above-identified patent and that said Letters Patent is hereby corrected as shown below:

In the Claims:

Column 7, line 24, "claims" should be --claim--

Signed and Sealed this
Third Day of September, 2013

Teresa Stanek Rea
*Acting Director of the United States Patent and Trademark Office*